US006717212B2

(12) United States Patent
Ju et al.

(10) Patent No.: US 6,717,212 B2
(45) Date of Patent: Apr. 6, 2004

(54) LEAKY, THERMALLY CONDUCTIVE INSULATOR MATERIAL (LTCIM) IN SEMICONDUCTOR-ON-INSULATOR (SOI) STRUCTURE

(75) Inventors: Dong-Hyuk Ju, Cupertino, CA (US); William George En, Milpitas, CA (US); Srinath Krishnan, Campbell, CA (US); Concetta E. Riccobene, Mountain View, CA (US); Zoran Krivokapic, Santa Clara, CA (US); Judy Xilin An, San Jose, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/879,724

(22) Filed: Jun. 12, 2001

(65) Prior Publication Data

US 2002/0185685 A1 Dec. 12, 2002

(51) Int. Cl.$^7$ .............................................. H01L 31/392
(52) U.S. Cl. .......................... 257/347; 257/52; 257/77; 257/524
(58) Field of Search ............................ 257/347, 77, 52, 257/524, 510

(56) References Cited

U.S. PATENT DOCUMENTS

| 4,498,951 A | * | 2/1985 | Tamura et al. | 156/612 |
| 5,387,541 A | * | 2/1995 | Hodge et al. | 437/71 |

(List continued on next page.)

FOREIGN PATENT DOCUMENTS

| EP | 1100127 A1 | | 5/2001 |
| JP | 63-288067 | * | 11/1988 |
| JP | 4-119634 | * | 4/1992 |
| JP | 06310427 | | 4/1994 |
| JP | 7-86298 | * | 3/1995 |
| JP | 7-235651 | * | 9/1995 |
| JP | 9-266317 | * | 10/1997 |
| JP | 2001-148479 | * | 5/2001 |
| JP | 2002-184993 | * | 6/2002 |

OTHER PUBLICATIONS

Furukawa et al., "Applications of the Silicon Wafer Direct–Bonding Technique to Electron Devices", Applied Surface Science, Amsterdam, NL, vol. 41/42, 1989, pp. 627–632, XP000431439.

Kobayashi et al., "An Intelligent Power Device Using Poly–Si Sandwiched Wafer Bonding Technique", Proceedings of 1995 International Symposium on Power Semiconductor Devices & IC's, Yokohama, May 23, 1995, pp. 58–62, XP000594241.

Fujino et al., "Silicon Wafer Direct Bonding Through the Amorphous Layer", Japanese Jounal of Applied Physics, Tokyo, Japan, vol. 34, Part 2, No. 10B, Oct. 1995, pp. L 1322–1324.

International Search Report for corresponding International Application PCT/US02/02991 dated Aug. 21, 2002.

Primary Examiner—Nathan J. Flynn
Assistant Examiner—Ahmed N. Sefer
(74) Attorney, Agent, or Firm—Renner, Otto, Boisselle & Sklar, LLP (57) ABSTRACT

A device and method for making a semiconductor-on-insulator (SOI) structure having a leaky, thermally conductive material (LTCIM) layer disposed between a semiconductor substrate and a semiconductor layer.

8 Claims, 6 Drawing Sheets

U.S. PATENT DOCUMENTS

| | | | | |
|---|---|---|---|---|
| 5,561,303 A | * | 10/1996 | Schrantz et al. | 257/77 |
| 5,569,620 A | * | 10/1996 | Linn et al. | 437/62 |
| 5,637,513 A | * | 6/1997 | Sugiyama | 438/311 |
| 5,773,151 A | * | 6/1998 | Begley et al. | 428/446 |
| 5,777,365 A | * | 7/1998 | Yamaguchi et al. | 257/347 |
| 5,855,693 A | * | 1/1999 | Murari et al. | 148/33.3 |
| 5,877,046 A | | 3/1999 | Yu et al. | 438/151 |
| 6,045,625 A | * | 4/2000 | Houston | 148/33.3 |
| 6,049,091 A | * | 4/2000 | Yokoyama | 257/52 |
| 6,285,072 B1 | * | 9/2001 | Maeda | 257/618 |
| 6,303,444 B1 | * | 10/2001 | Burr | 438/289 |
| 6,380,589 B1 | * | 4/2002 | Krivokapic | 257/347 |
| 6,424,009 B1 | * | 7/2002 | Ju | 257/347 |
| 6,429,091 B1 | * | 8/2002 | Chen et al. | 438/423 |
| 6,448,115 B1 | | 9/2002 | Bae | 438/151 |
| 6,573,565 B2 | * | 6/2003 | Clevenger et al. | 257/355 |
| 2001/0023111 A1 | * | 9/2001 | Yuan | |
| 2002/0096717 A1 | * | 7/2002 | Chu et al. | 257/347 |
| 2002/0132395 A1 | * | 9/2002 | Iyer et al. | 438/149 |
| 2003/0040180 A1 | * | 2/2003 | Canham et al. | 438/689 |
| 2003/0094637 A1 | * | 5/2003 | Awano | 257/288 |

* cited by examiner

LEAKY, THERMALLY CONDUCTIVE INSULATOR MATERIAL (LTCIM) IN SEMICONDUCTOR-ON-INSULATOR (SOI) STRUCTURE

TECHNICAL FIELD

The present invention generally relates to the manufacture of semiconductor structures and, more specifically, relates to the manufacture of semiconductor-on-insulator (SOI) structures.

BACKGROUND ART

Semiconductor-on-insulator (SOI) structures have several advantages over conventional bulk substrates: the elimination of latch-up, reduced short-channel effects, improved radiation hardness, dynamic coupling, lower parasitic junction capacitance, and simplified device isolation and fabrication. Such advantages allow semiconductor device manufacturers to produce low-voltage low-power high-speed devices thereon. For example, metal-oxide semiconductor field effect transistors (MOSFETs) are commonly formed on SOI structures. However, MOSFETs formed on such SOI structures suffer from a floating body effect (FBE) and self-heating.

Unlike bulk silicon MOSFETs, an SOI MOSFET is usually electrically floating in relation to the substrate. In a non-fully depleted MOSFET, carriers (holes in nMOSFETs and electrons in pMOSFETs) generated by impact ionization accumulate near the source/body junctions of the MOSFET. Eventually, sufficient carriers will accumulate to forward bias the body with respect to the source thus lowering the threshold voltage through the body-bias effect. Extra current will start flowing resulting in a "kink" in the I-V characteristics. The extra current flow reduces the achievable gain and dynamic swing in analog circuits, and gives rise to an abnormality in the transfer characteristics in digital circuits. Additionally, the FBE causes higher device leakages and undesirable transient effects.

One attempted solution to solve problems due to the FBE is to provide a contact to the body for hole current collection. However, currently available hole collection schemes, including the use of a side-contact or a mosaic source are very inefficient and consume significant amounts of wafer area.

Another problem associated with SOI structures is self-heating. Self-heating due to poor thermal conductivity of the buried oxide layer, in addition to causing circuit performance degradation, also increases device failure due to Joule heating. Further, severe localized silicon heating can result in junction melting and silicon melt filament formation. Such junction melting and filament formation may cause electrical shorts among the gate, source, drain and body of the MOSFET, thus resulting in device failure.

The thermal conductivity of the insulator materials determines in part how efficiently the heat is dissipated. The heat generated in the device regions propagates vertically to the semiconductor substrate via the BOX layer, $SiO_2$ in conventional silicon-on-insulator structures, and laterally to the oxide isolation trenches in the non-device regions. The thermal conductivity of $SiO_2$ is about 1.7 W/mK, whereas the thermal conductivity of the pure Si substrate is about 170 W/mK. A material with a lower thermal conductivity value means the material dissipates heat less effectively than the material with a higher value. Thus, the lower thermal conductivity of $SiO_2$, the BOX layer, does not propagate efficiently the heat generated by the SOI devices to the substrate through the BOX layer. Therefore, the $SiO_2$ BOX layer inhibits cooling of the SOI devices and causes severe self-heating effects, which prevents the maximum available power consumption from increasing.

Additionally, this increases the maximum interconnect temperature, and makes conduction cooling through the source, drain, and interconnects important. In addition, the device mobility is reduced as a result of the higher channel temperature, reducing the maximum drain saturation current and causing a negative differential conductance in the saturation region. Thermal protection schemes designed for SOI circuits have been proposed using contact plugs in diodes. Although effective in dissipating heat, contact plugs consume large wafer area, introduce large delays, and increase manufacturing costs.

Therefore, there exists a strong need in the art for an SOI structure with a buried insulator material that is leaky enough to bleed off the extra carriers into a channel of the substrate, has a resistance approximately equal to $SiO_2$ and thermally conducts heat away from the device at a rate greater than a conventional $SiO_2$ insulator layer at room temperature.

SUMMARY OF THE INVENTION

According to one aspect of the invention, the invention is a semiconductor-on-insulator (SOI) structure having a leaky, thermally conductive insulator material (LTCIM) layer disposed between a semiconductor substrate and a semiconductor layer. The SOI structure has an active region defined laterally by isolation regions such as shallow trench isolation (STI) regions and vertically by the LTCIM layer.

According to another aspect of the invention, the invention is a method of fabricating a semiconductor-on-insulator (SOI) structure having a LTCIM layer disposed between a semiconductor substrate and a semiconductor layer. The method includes the steps of depositing an LTCIM layer on a first semiconductor substrate and depositing an LTCIM layer on a second semiconductor substrate. Further, the method includes the step of creating a zone of weakness under a surface of one of the semiconductor substrates. Next, the method requires the placing of one of the semiconductor substrates on top of the other semiconductor substrate such that the LTCIM layer of the first semiconductor substrate is in contact with the LTCIM layer of the second semiconductor substrate. The method also includes the step of breaking the zone of weakness of the one semiconductor substrate and repairing a damaged surface resulting from the breaking of the zone of weakness of the one semiconductor substrate.

According to another aspect of the invention, the invention is a method of fabricating an SOI structure as described above. However, the method step of repairing the surface resulting from the breaking of the zone of weakness further includes the step of polishing the surface in order to remove residual weak zone damage.

According to another aspect of the invention, the invention is a method of fabricating an SOI structure as described in the first method above. The method further includes the additional step of fusing the LTCIM layer of the first semiconductor substrate with the LTCIM layer of the second semiconductor substrate.

BRIEF DESCRIPTION OF DRAWINGS

These and further features of the present invention will be apparent with reference to the following description and drawings, wherein.

DISCLOSURE OF INVENTION

In the detailed description that follows, identical components have been given the same reference numerals. To illustrate the present invention in a clear and concise manner, the drawings may not necessarily be to scale and certain features may be shown in a partial schematic format.

The present invention is a semiconductor on insulator (SOI) structure, and method of making the same, comprising an insulator layer of leaky, thermally conductive insulator material (LTCIM), e.g. polysilicon, undoped single crystalline, porous silicon, amorphous silicon, or the like, interposed between a semiconductor substrate and a semiconductor layer. Electronic devices such as metal-oxide semiconductors field effect transistors, i.e. MOSFETs, may be formed in device regions of the semiconductor layer defined laterally by isolation regions such as shallow trench isolation (STI) regions and vertically by the insulator layer.

MOSFETs formed on such SOI structures will be significantly less affected by the FBE and self-heating due to the LTCIM layer being made of a material with properties that allow the extra carriers to bleed off (leak) into a channel of the substrate at a level higher than the currently used material of $SiO_2$ but lower than the maximum allowable leakage, while more efficiently dissipating heat due to a significantly higher thermal conductivity. The LTCIM layer has an electrical resistivity or specific resistance greater than that of the semiconductor substrate and the semiconductor layer.

Specific resistance refers to the opposition presented by a material to the flow of electricity. Resistivity is an intrinsic property of a material independent of the amount or shape. Pure Si normally used in the substrate and semiconductor layer has a higher resistivity than metals, because the number of charge carriers is much reduced. Amorphous silicon has a resistivity slightly higher than pure Si due to the arrangement of the lattice structure having a large number of dangling bonds. The resistivity of amorphous silicon changes due to the number of dangling bonds. The number of dangling bonds can be reduced through an annealing process or through the introduction of dangling bond terminators such as hydrogen and fluorine during the production process. Thus, the leakage current allowed through the amorphous silicon layer can be tailored by controlling the number of dangling bonds in the lattice structure. Further, the leakage current through the LTCIM layer can be tailored so that the total chip power consumption does not significantly increase.

Additionally, an LTCIM layer of silicon will have a thermal conductivity of between about 30 W/mK to about 170 W/m K. This is about 30 to about 100 times greater than the thermal conductivity of $SiO_2$. Since the LTCIM layer has a substantially greater thermal conductivity than that of $SiO_2$, improved heat dissipation can be obtained.

Also, the LTCIM layer can be regarded as a dielectric with respect to the parasitic capacitance between the substrate and a conductor formed over the device region. In such a case, the electrical resistivity of the LTCIM layer would be greater than the leakage current for the operating frequency range of the semiconductor device. Therefore, the parasitic capacitance can be kept low. For example, when the operating frequency, or the applicable electric signal frequency of the semiconductor device is 1 GHz, the electrical resistivity of the LTCIM layer is preferably 10 Ohms-cm or greater.

Figure 1:
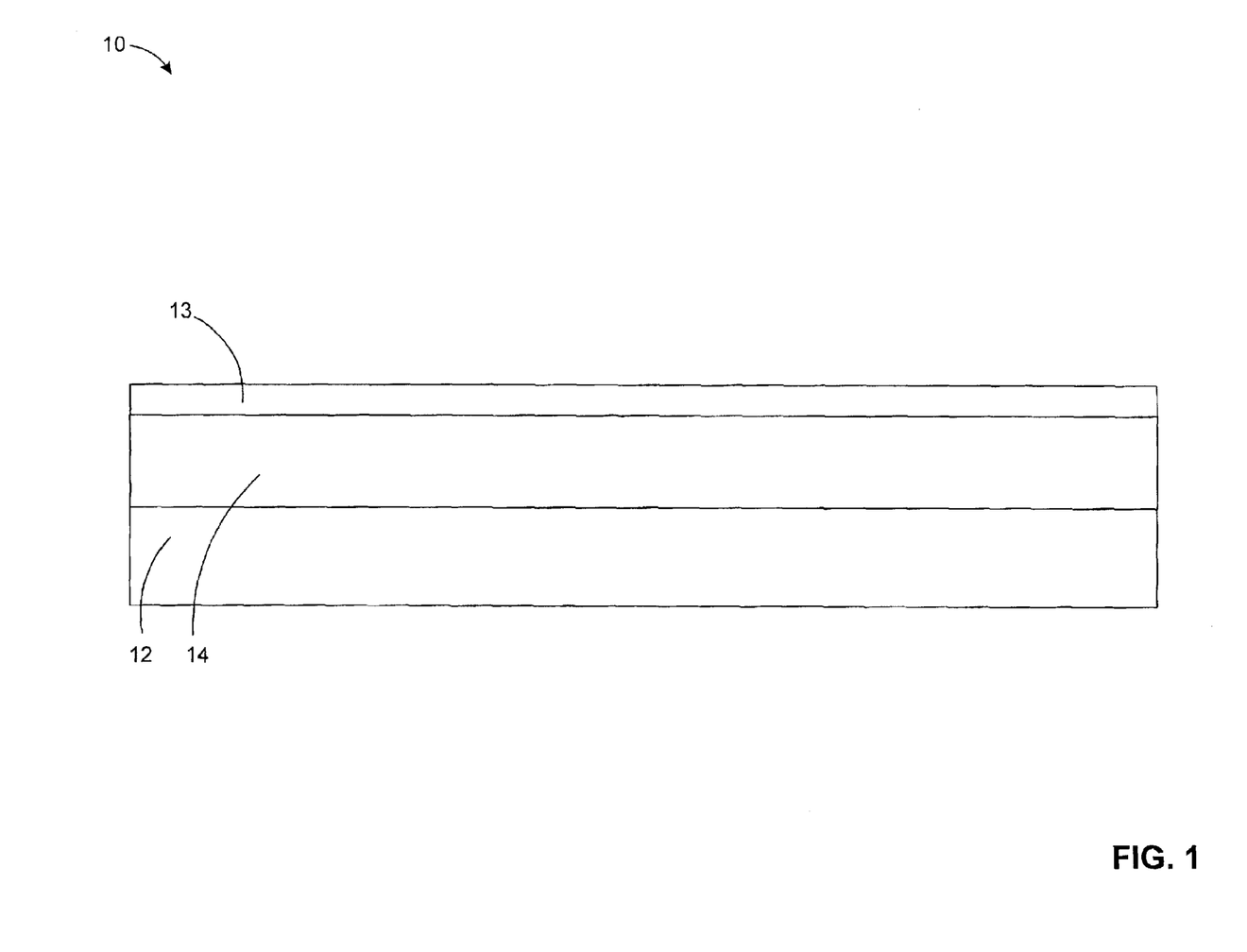
FIG. 1 is a cross-section of an SOI structure according to the present invention.

Now referring to FIG. 1, an exemplary embodiment of an SOI structure 10 is illustrated. The SOI structure 10 is formed of a semiconductor substrate 12, a buried LTCIM layer 14 formed on the semiconductor substrate 12 and a semiconductor layer 13 disposed on the LTCIM layer 14. The LTCIM layer 14 in one embodiment is undoped porous silicon. However, the LTCIM layer 14 may be undoped single crystalline, porous silicon, amorphous silicon, or the like or any refractory material that has the characteristics described herein for resistivity, thermal conductivity and resistance-capacitance (RC) time constant.

The electrical properties of amorphous silicon depend strongly on the dangling bonds in the film structure. Amorphous silicon prepared by the decomposition of silane ($SiH_4$) in a plasma can be doped with boron or phosphorus. The maximum mobility for the highest phosphorous doped amorphous silicon is about 100 $cm^2$/V-s. Ionized impurity scattering are important factors limiting the mobility. Additionally, dangling-bond terminators such as hydrogen or fluorine may be used to effectively terminate dangling bonds.

The thermal conductivity of amorphous silicon is a strong function of the structure of the film. The thermal conductivity is about 30 W/cm-K, twenty percent of the single-crystal value.

An exemplary LTCIM layer 14 will be tailored to provide mobility for the carriers as well as a higher thermal conductivity than traditional $SiO_2$ to more efficiently dissipate heat. The exemplary LTCIM layer 14 may have a thickness of between 1800 and 2200 Å. Whereas, an exemplary semiconductor layer 13 disposed on the LTCIM layer 14 may have a thickness of between 800 and 1000 Å. Suitable semiconductor materials such as silicon (Si), silicon carbide (SiC), or silicon germanium (SiGe) may be used as the semiconductor layer 13 disposed on the LTCIM layer 14. Within the semiconductor layer 13 disposed on the LTCIM layer 14, electrical devices may be formed.

Figure 2:
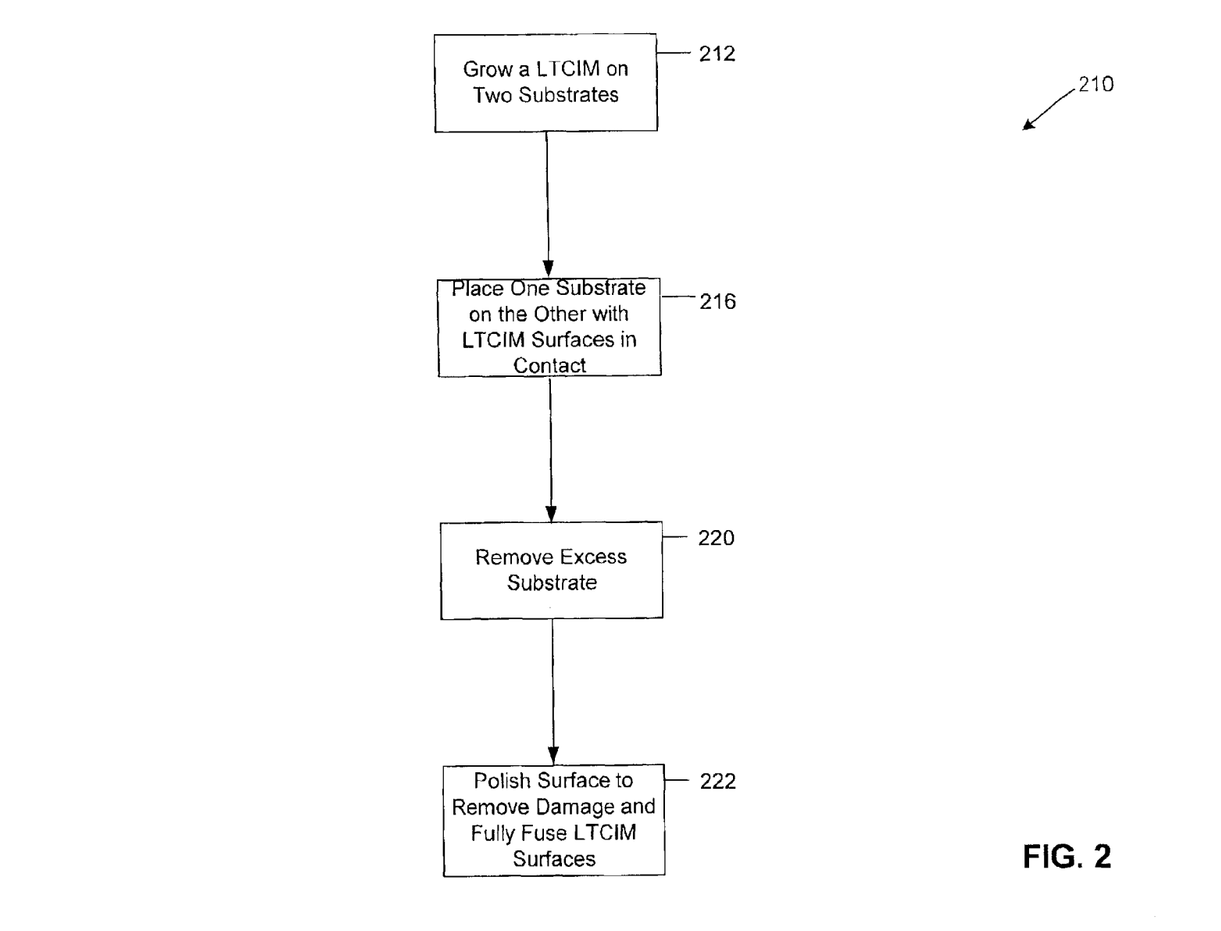
FIG. 2 is a flow diagram of a method of manufacturing the SOI structure according to the present invention.
Figure 3A:
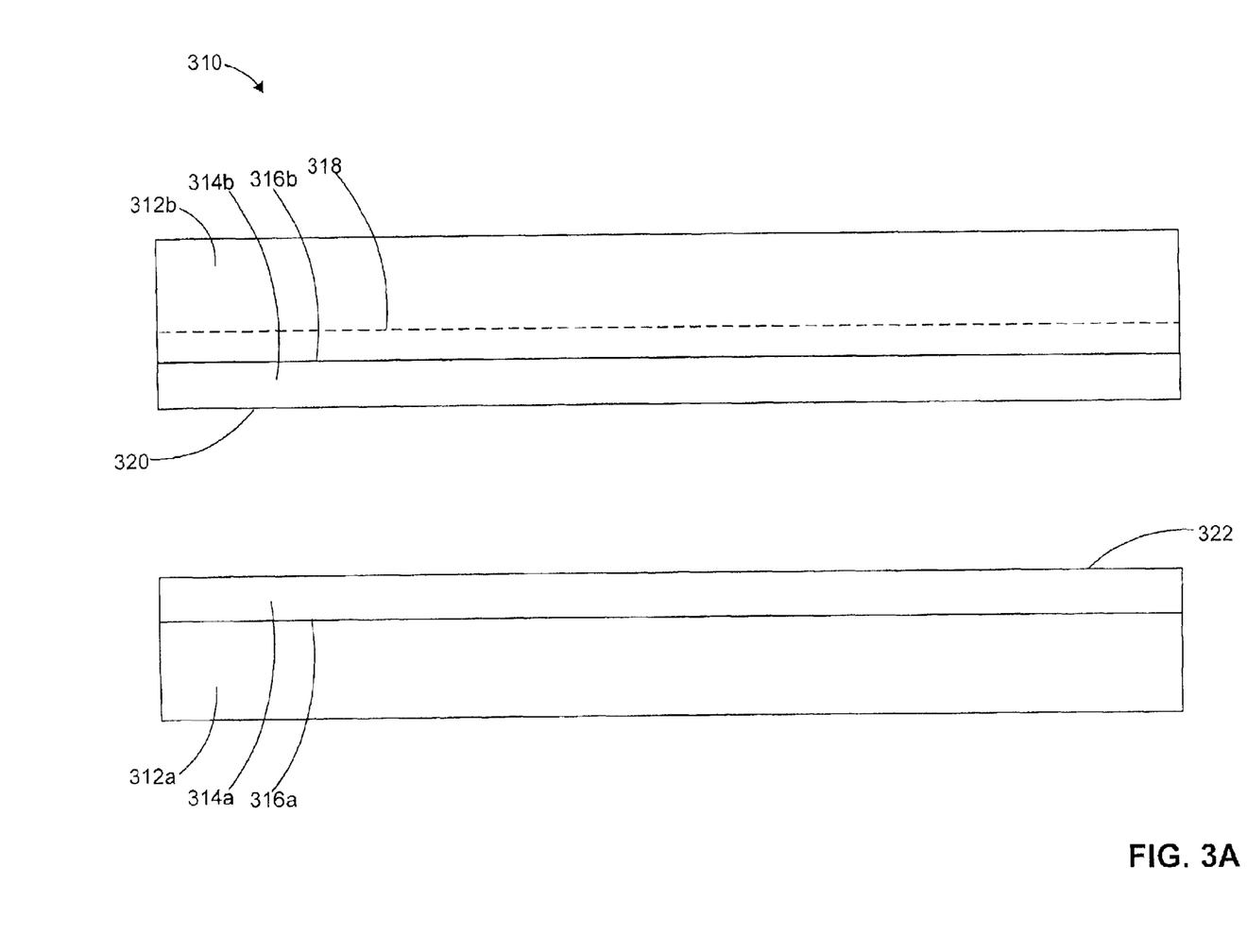
FIGS. 3A–3C are cross-section views of the SOI structure according to the present invention at intermediate stages of manufacture.
Figure 3B:
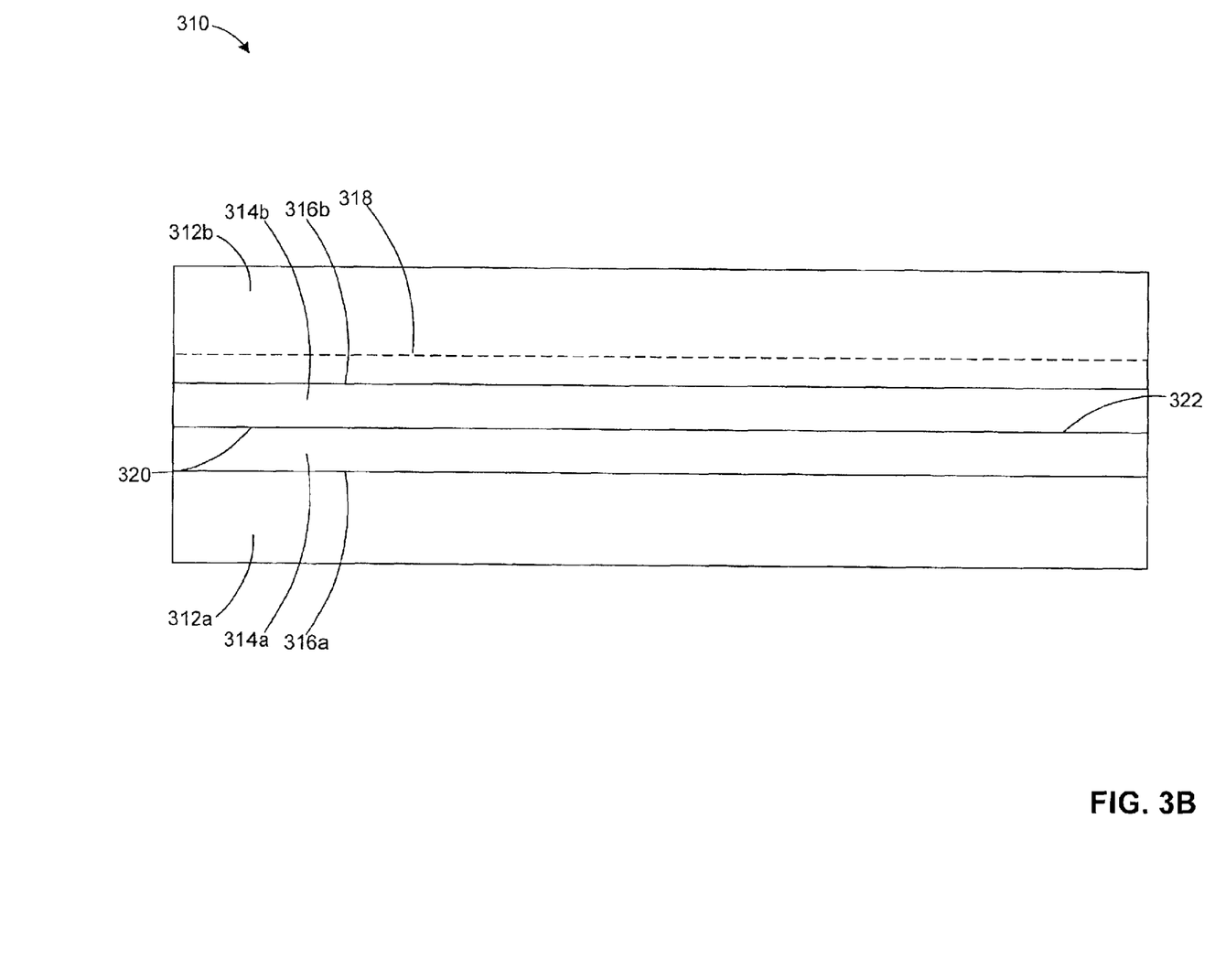
Figure 3C:
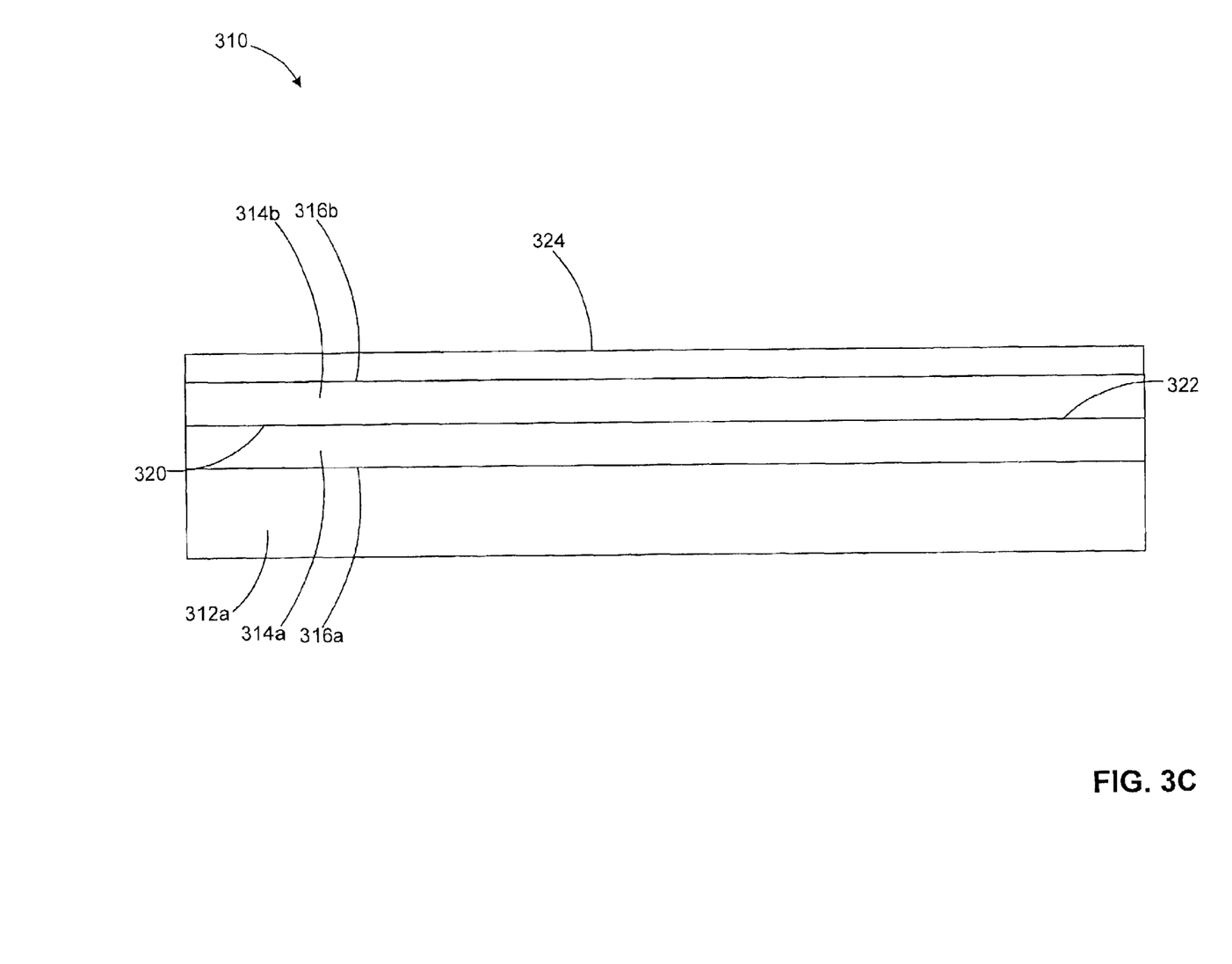

The steps of a method 210 for fabricating an SOI structure 310 (which may be similar to the semiconductor device 10 described above) are outlined in the flow chart shown in FIG. 2. FIGS. 3A–3C illustrate various steps of the method 210. It will be appreciated that the method 210 and the semiconductor device 310 described below are merely exemplary, and that suitable embodiments with variations in materials, thicknesses, and/or steps may alternatively be used in the method 210 and/or the SOI structure 310.

In step 212, semiconductor substrates 312a, 312b have LTCIM layers 314a, 314b formed on surfaces 316a, 316b respectively as an intermediate stage of manufacture for the SOI structure 310. As shown in FIG. 3A, the semiconductor substrate 312b with the LTCIM layer 314b has been flipped over and placed above semiconductor substrate 312a with the LTCIM layer 314a. As shown by the dashed line in FIG.

3A, semiconductor substrate 312b has a zone of weakness 318 (a region which has been structurally weakened to allow the substrate to break along a plane indicated by the dashed line when an appropriate amount of force is applied along the plane) formed below the surface 316b. Each exemplary LTCIM layer may have a thickness of between 900 and 1100 Å. Whereas, each exemplary semiconductor substrate 312a, 312b may have a thickness of between 800 and 1000 Å. Suitable semiconductor materials such as silicon (Si), silicon carbide (SiC), or silicon germanium (SiGe) may be used as the semiconductor material in semiconductor substrates 312a, 321b.

It will be appreciated that other methods may be used to form the intermediate substrates shown in FIG. 3A. It will further be appreciated that any processes, which will allow the semiconductor substrate to be broken along a plane leaving a thin layer of silicon on the SOI structure, may form the zone of weakness 318. It will also be appreciated that the zone of weakness may be formed through the surface 316b and a thin portion of the semiconductor substrate 312b before the LTCIM layer is disposed thereon. It will also be understood that the zone of weakness alternatively may be formed through a thick portion of the semiconductor substrate 312b opposite the LTCIM layer after the LTCIM layer has been disposed thereon. Further, it will be understood that a zone of weakness may be formed through the LTCIM layer and the thin portion of the semiconductor substrate 312b.

In step 216 of the method 210, a surface 320 of the LTCIM layer 314b is placed in contact with a surface 322 of the LTCIM layer 314a. Thus, surfaces 320 and 322 adhere to each other due to their adhesive characteristics. It will be appreciated that adhesive characteristics of such materials are well-known in the art. For example, it is known that when two ultra-clean and ultra-smooth surfaces are placed in contact, they will adhere to each other well enough for further processing to be done. It will be appreciated that an annealing process may be done at this time to more significantly adhere the structure for further processing. The resulting structure is illustrated in FIG. 3B.

In step 220, the semiconductor substrate 312b is broken along the zone of weakness 318. It will be appreciated that processes, which include heat, or mechanical pressure, for example, may break the zone of weakness. The resulting structure is illustrated in FIG. 3C.

In step 222 of the method 210, a polishing process is performed on the exposed damaged surface 324. The polishing process removes residual weak zone damage. The polishing process repairs the upper surface 324 of the SOI substrate 310 for future processing of electrical devices. The resulting structure is illustrated in FIG. 3C.

Further, in step 222, the SOI substrate 310 may be heated until the LTCIM layers 314a and 314b are fully fused. The final structure is illustrated in FIG. 1.

It will be appreciated that many alternative sequences or steps may be used to accomplish the SOI structure 310. For example, the heating and fusing process in step 222 may be done following step 216. Examples of other well-known techniques which may be used in the formation of the SGI structure 310 include zone melting recrystallization (ZMR), separation by implanted oxygen (SIMOX), Bonded and Etchback (BESOI) and the Smart-Cut.

Figure 4:
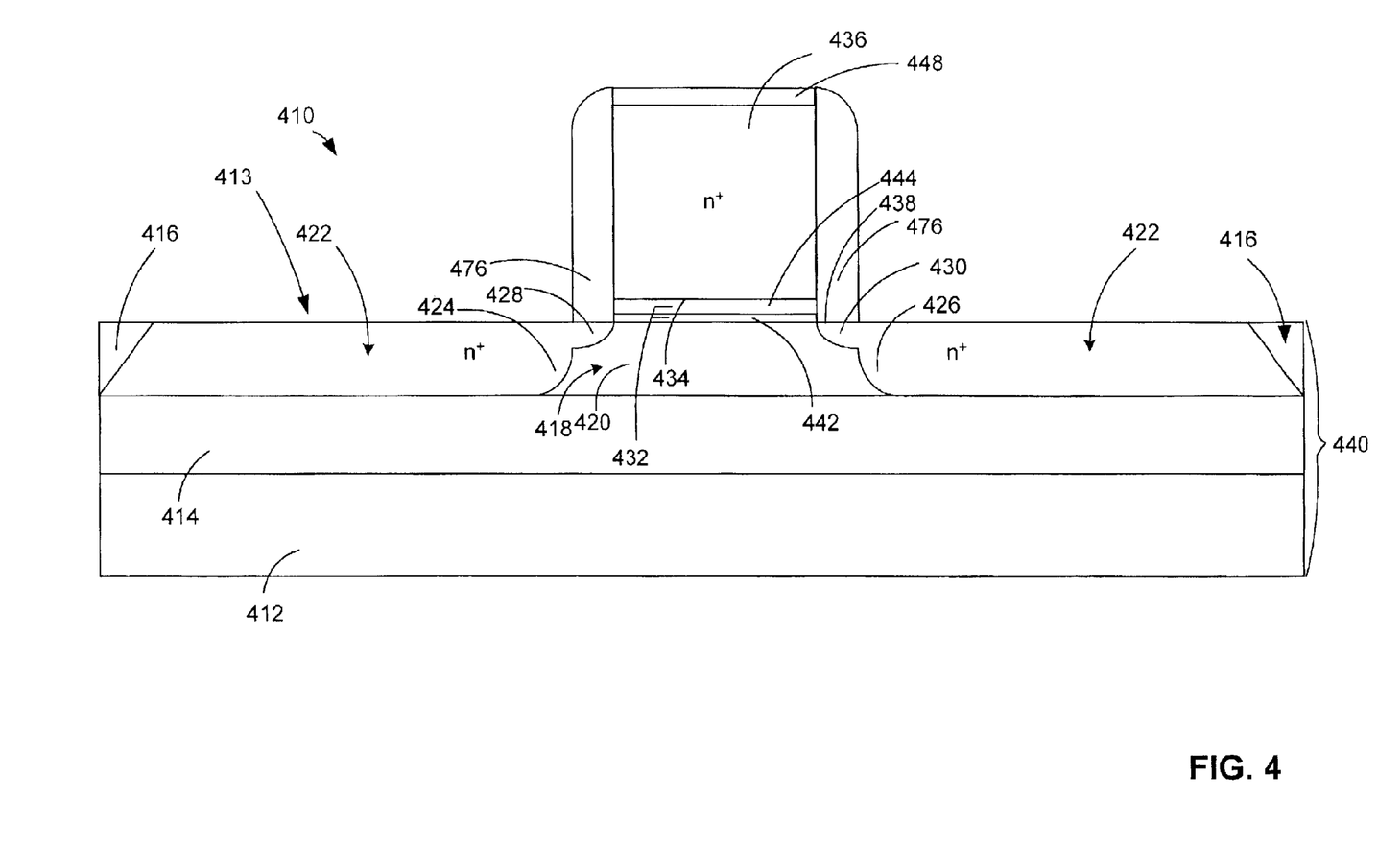
FIG. 4 is a cross-section of an SOI structure according to the present invention having a device formed thereon.

A device 410 on a semiconductor-on-insulator (SOI) structure 440 of the present invention is shown in FIG. 4 and described below, although other devices may be formed as well without departing from the invention herein described. Additionally, a device 410 or other devices may be formed on other types of SOI structures such as germanium-on-insulator wherein the insulator material is a leaky thermally conductive material as described above. It will be appreciated that the exemplary semiconductor device 410 described below may include many variations in materials, thicknesses, and/or structures.

Referring now to FIG. 4, an SOI substrate 440 is shown with an electrical device 410 formed thereon. The device 410 includes a conventional polysilicon gate. As shown in FIG. 4, the SOI substrate 440 includes a semiconductor substrate 412, a LTCIM layer 414 formed on the semiconductor substrate 412 and a semiconductor layer 413 disposed on the LTCIM layer 414. Within the semiconductor layer 413 disposed on the LTCIM layer 414, shallow trench isolation (STI) regions 416 along with the LTCIM layer 414 define the placement of a semiconductor active region 418. The STI regions 416 are insulator-filled to electrically isolate individual electrical devices such as the device 410. Other isolation techniques that are known in the art may be used to isolate the device 410.

In an exemplary embodiment, as illustrated in FIG. 4, the active region 418 has a channel 420, and source and drain regions 422. The source and drain 422 are shown with respective deep implant regions 424 and 426, as well as respective extension regions 428 and 430. The active region 418 may be doped with p-type dopants for n-type channel devices and/or n-type dopants for p-type channel devices. An exemplary range of concentration of these dopants is between $1 \times 10^{18}$ atoms/cm$^3$ and $5 \times 10^{18}$ atoms/cm$^3$ for the p-type channel 420 and between $1 \times 10^{20}$ and $2 \times 10^{20}$ atoms/cm$^3$ for the N+ regions 422.

A gate dielectric is interposed between the lower surface 434 of a gate electrode 436 and an upper surface 438 of the SOI semiconductor substrate 440. The gate dielectric 432 illustrated in FIG. 4 is a multi-layer dielectric, however the gate dielectric could be a single layer dielectric. The gate dielectric 432 may be made of suitable gate dielectric materials, such as silicon dioxide ($SiO_2$), silicon nitride ($Si_3N_4$), aluminum oxide ($Al_2O_3$), hafnium oxide ($HfO_2$), silicon oxynitride (SiON), or the like. In this embodiment, dielectric layer 442 is made of $SiO_2$ and dielectric layer 444 is made of $Si_3N_4$. The gate electrode 436 may be made of typical, well-known conductive materials, for example polysilicon.

On top of the gate electrode 436 is an oxide layer 448. The oxide layer 448 may be made of silicon dioxide ($SiO_2$) or any of a variety of suitable materials, which could be used to protect portions of the gate electrode 436 from an etchant. Spacers 476 extend upward from the upper surface 438 of the SOI substrate 440 on either side of the gate electrode 436. Exemplary spacers 476 may have a height of between 3000 and 4000 Å.

It will be appreciated that known methods may be used to form the device 410 shown in FIG. 4. It will further be appreciated that the insulator-filled isolation trenches 416 may be formed in an intermediate step of a method, rather than being formed prior to or after the forming of the device 410.

The source and the drain regions 422 regions may be formed by a combination of implants, such as main perpendicular implants and extension perpendicular implants. The extension perpendicular implant is a relatively low energy, low concentration implant which is capable of producing the source and drain extensions 428 and 430. The total concentration of the extension implants may be, for example, between $1 \times 10^{19}$ atoms/cm$^3$ and $1 \times 10^{20}$ atoms/cm$^3$. The extension perpendicular implants may be of the same material as the main perpendicular implant, or may alternatively include different materials. However, it will be appreciated that the extension implants may be different from one another, if so desired. Next, the main source and drain regions may be formed by a main perpendicular implant, which will not affect the extension implant due to the formation of spacers 476 which act as masks. The main perpendicular implant is a relatively high energy, high concentration implant which is capable of producing the source and drain deep implant regions 424 and 426. An exemplary range of implant dose for the perpendicular implant is between $1\times10^{15}$ and $5\times10^{15}$ atoms/cm$^2$.

After implantation, the SOI structure 440 is subjected to rapid thermal annealing (RTA). Exemplary RTA may be performed for between five and fifteen seconds at a temperature of 1,020–1,050° C.

The present SOI structure is significantly more efficient at moving carriers and consumes significantly less wafer area than the side-contact solutions heretofore proposed to reduce thermal effects. As will be better appreciated in view of the following description, such SOI structures may have devices such as MOSFETs formed thereon. Such MOSFETs will be significantly less affected by the floating body effect (FBE) and self-heating due to the leaky and thermal conductive characteristics, respectively of the LTCIM layer. The carriers, which accumulate near the source/body junctions of the MOSFET, will not accumulate sufficiently to forward bias the body with respect to the source. Thus, the lowering of the threshold voltage through the body-bias effect will be reduced. Further, extra current will not start flowing, thus the "kink" in the I-V characteristics will be significantly reduced or eliminated. Further still, this maintains the achievable gain and dynamic swing in analog circuits, and eliminates the abnormality in the transfer characteristics in digital circuits. Additionally, FBEs related to higher device leakages and the undesirable transient effect would be reduced.

The increased thermal conductivity of the LTCIM layer reduces device failure due to Joule heating. The thermal conductive characteristics of the present invention significantly reduce the incident of severe localized silicon heating reducing the possibility of junction melting and the formation of silicon melt filaments. Thus, electrical shorts among the gate, source, drain and body of the transistors that may have resulted in device failure are significantly reduced. The thermal protection provided by the SOI structure of the present invention allows devices to consume less silicon area and operate at faster speeds.

Although particular embodiments of the invention have been described in detail, it is understood that the invention is not limited correspondingly in scope, but includes all changes, modifications and equivalents coming within the spirit and terms of the claims appended hereto.

What is claimed is:

1. A semiconductor-on-insulator (SOI) structure comprising;
    a semiconductor substrate;
    a leaky, thermally conductive insulator material (LTCIM) layer disposed directly on the semiconductor substrate;
    a semiconductor layer disposed directly on the LTCIM layer; and
    active regions defined in the semiconductor layer by isolation trenches and the LTCIM layer,
    wherein the LTCIM layer comprises at least one of doped amorphous silicon having a dopant species selected from one of boron, phosphorous and fluorine, undoped amorphous silicon and undoped porous silicon,
    wherein the LTCIM layer extends over an entire lateral dimension of the semiconductor substrate, and
    wherein the semiconductor layer is germanium (Ge).

2. The SOI structure according to claim 1, wherein the semiconductor substrate material is silicon (Si), silicon carbide (SiC), silicon germanium (SiGe) or any other semiconductive material.

3. The SOI structure according to claim 1, wherein the LTCIM layer has a thermally conductivity value between about 30 W/mK to about 170 W/mK.

4. The SOI structure according to claim 1, wherein the LTCIM layer preferably has a resistivity value 10 Ohms-cm or greater.

5. A semiconductor-on-insulator (SOI) structure comprising:
    a semiconductor substrate;
    a leaky, thermally conductive insulator material (LTCIM) layer disposed directly on the semiconductor substrate; and
    a semiconductor layer disposed directly on the LTCIM layer,
    wherein the LTCIM layer comprises at least one of doped amorphous silicon having a dopant species selected from one of boron, phosphorous and fluorine, undoped amorphous silicon and undoped porous silicon,
    wherein the LTCIM layer extends over an entire lateral dimension of the semiconductor substrate, and
    wherein the semiconductor layer is germanium (Ge).

6. The SOI structure according to claim 5, wherein the semiconductor substrate material is silicon (Si), silicon carbide (SiC), silicon germanium (SiGe) or any other semiconductive material.

7. The SOI structure according to claim 5, wherein the LTCIM layer has a thermally conductivity value between about 30 W/mK to about 170 W/mK.

8. The SOI structure according to claim 2, wherein the LTCIM layer preferably has a resistivity value 10 Ohms-cm or greater.

* * * * *

UNITED STATES PATENT AND TRADEMARK OFFICE
CERTIFICATE OF CORRECTION

PATENT NO. : 6,717,212 B2  Page 1 of 1
APPLICATION NO. : 09/879724
DATED : April 6, 2004
INVENTOR(S) : Ju et al.

It is certified that error appears in the above-identified patent and that said Letters Patent is hereby corrected as shown below:

Claim 8, Line 1: replace "claim 2" with --claim 5--.

Signed and Sealed this

Fifth Day of February, 2008

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,717,212 B2 |
| APPLICATION NO. | : 09/879724 |
| DATED | : April 6, 2004 |
| INVENTOR(S) | : Ju et al. |

Page 1 of 1

It is certified that error appears in the above-identified patent and that said Letters Patent is hereby corrected as shown below:

<u>Column 8</u> Claim 8, Line 51:   replace "claim 2" with --claim 5--.

This certificate supersedes the Certificate of Correction issued February 5, 2008.

Signed and Sealed this

Twenty-sixth Day of February, 2008

JON W. DUDAS
*Director of the United States Patent and Trademark Office*